United States Patent [19]
Johnson et al.

[11] Patent Number: 6,107,847
[45] Date of Patent: Aug. 22, 2000

[54] ZERO POWER RESET CIRCUIT FOR LOW VOLTAGE CMOS CIRCUITS

[75] Inventors: Mark G. Johnson, Los Altos; Kevin S. Donnelly, San Francisco; Clemenz L. Portmann, Cupertino, all of Calif.

[73] Assignee: Rambus Inc., Mountain View, Calif.

[21] Appl. No.: 09/000,717

[22] Filed: Dec. 30, 1997

[51] Int. Cl.[7] .................................................. H03L 7/00
[52] U.S. Cl. ................................................ 327/143; 327/198
[58] Field of Search ..................................... 327/143, 142, 327/198, 199, 383, 217, 291, 292, 298

[56] References Cited

U.S. PATENT DOCUMENTS

| | | | |
|---|---|---|---|
| 4,210,829 | 7/1980 | Wong et al. | 307/296 R |
| 4,572,966 | 2/1986 | Hepworth | 327/143 |
| 4,581,552 | 4/1986 | Womack et al. | 327/143 |
| 4,591,745 | 5/1986 | Shen | 307/592 |
| 4,607,178 | 8/1986 | Sugie et al. | 307/594 |
| 4,902,907 | 2/1990 | Haga et al. | 307/272.3 |
| 4,970,408 | 11/1990 | Hanke et al. | 307/272.3 |
| 5,323,067 | 6/1994 | Shay | 307/272.3 |
| 5,734,280 | 3/1998 | Sato | 327/143 |
| 5,821,787 | 10/1998 | McClintock et al. | 327/143 |

*Primary Examiner*—Terry D. Cunningham
*Assistant Examiner*—Quan Tra
*Attorney, Agent, or Firm*—Blakely, Sokoloff, Taylor & Zafman LLP

[57] ABSTRACT

A pulse generating circuit that includes an unbalanced latch and a feedback circuit. The unbalanced latch is configured to generate a latch signal having a predetermined state in response to application of power to the circuit. The feedback circuit is coupled in a negative feedback arrangement with the unbalanced latch and generates a pulse signal for a predetermined period of time in response to the latch signal.

29 Claims, 9 Drawing Sheets

ZERO POWER RESET CIRCUIT FOR LOW VOLTAGE CMOS CIRCUITS

FIELD OF THE INVENTION

The present invention relates generally to power up reset circuits.

BACKGROUND

Conventional very large scale integrated (VLSI) circuits may contain thousands or millions of transistors, registers, latches, and flip-flops which store state information. These circuit elements must be properly initialized or reset prior to functional operation. Initialization is often performed by means of a power up reset signal.

A power up reset signal is a digital signal that is asserted while external power is being applied to a chip or integrated circuit. The power up reset signal drives the set or reset inputs of, for example, flip-flops to initialize the state of the integrated circuit to a predefined and known condition. After a suitable delay after the application of the external power to the integrated circuit, the power up reset signal is de-asserted.

It is desirable for a power up reset circuit to dissipate low amounts of static or direct current (DC) power when an integrated circuit is operating. The power up reset circuit is active only for a brief period of time when power is first applied to the integrated circuit. Therefore, any power dissipated by the power up reset circuit at any other time when the integrated circuit is functioning is wasted power. This may undesirably run down the battery of a system that includes the power up reset circuit. Reset signal generating circuits disclosed in U.S. Pat. No. 4,607,178 and U.S. Pat. No. 4,902,907 suffer from this problem.

It is also desirable for a power up reset circuit to function correctly at low operating voltages. Integrated circuits are being required to function at lower and lower supply voltages. For integrated circuits that are manufactured from complementary metal oxide semiconductor (CMOS) process technologies, low power supply voltages typically result in lower power dissipation and higher speed circuits due to shorter channel lengths and thinner oxides. It is highly desirable for a CMOS power up reset circuit to function correctly when the power supply voltage (VDD) is approximately twice the absolute value of the threshold voltage (VT) of one of the NMOS or PMOS transistors. The power up reset circuits disclosed in U.S. Pat. No. 4,591,745, U.S. Pat. No. 4,591,745, and U.S. Pat. No. 4,970,408 do not function properly when their power supply voltage are only slightly above twice the absolute threshold voltage of their NMOS or PMOS transistors.

It is also desirable for a power up reset circuit to generate a power up reset signal having a guaranteed minimum pulse width (active or assertion time). If there is a known, guaranteed, minimum time during which the power up reset signal is active, state bits may be set or cleared during this time. Therefore, a guaranteed minimum reset power up signal pulse width facilitates the design of state flip-flops and finite state machines which use the power up reset signal. Power up reset circuits disclosed in U.S. Pat. No. 4,210,829, U.S. Pat. No. 4,970,408, and U.S. Pat. No. 5,323,067 do not generate a power up reset signal having a guaranteed pulse width.

SUMMARY AND OBJECTS OF THE INVENTION

Therefore, it is an object of the present invention to provide a power up reset circuit that dissipates approximately zero static (DC) power when the power up reset circuit de-asserts the power up reset signal.

It is another object of the present invention to provide a power up reset circuit that is compatible with low-voltage CMOS integrated circuits.

It is a further object of the present invention to provide a power up reset circuit that generates a power up reset signal for a predetermined or guaranteed amount of time.

These and other objects are met by a pulse generating circuit that includes an unbalanced latch and a feedback circuit. The unbalanced latch is configured to generate a latch signal having a predetermined state in response to application of power to the circuit. The feedback circuit is coupled in a negative feedback arrangement with the unbalanced latch and generates a pulse signal for a predetermined period of time in response to the latch signal.

Other objects, features, and advantages of the present invention will be apparent from the accompanying drawings and from the detailed description which follows below.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

A power up reset circuit is disclosed that dissipates approximately zero static (DC) power when the power up reset signal is de-asserted, is functional at low operating supply voltages, and generates a power up reset signal having a guaranteed minimum pulse width. According to one embodiment, the power up reset circuit includes an unbalanced latch circuit that generates a latch signal having a predetermined state when power is applied to the power up reset circuit. The latch signal is provided to a buffer that inverts the latch signal and couples the inverted latch signal to one input of an OR gate. The inverted latch signal causes the OR gate to assert or activate the power up reset signal. The inverted latch signal is then delayed through a delay circuit and coupled to a reset input of the unbalanced latch.

When the delayed inverted latch signal reaches the threshold voltage of the reset input of the unbalanced latch, the latch signal changes state and causes the power up reset signal to be de-asserted after a delay time through the delay circuit.

Figure 1:
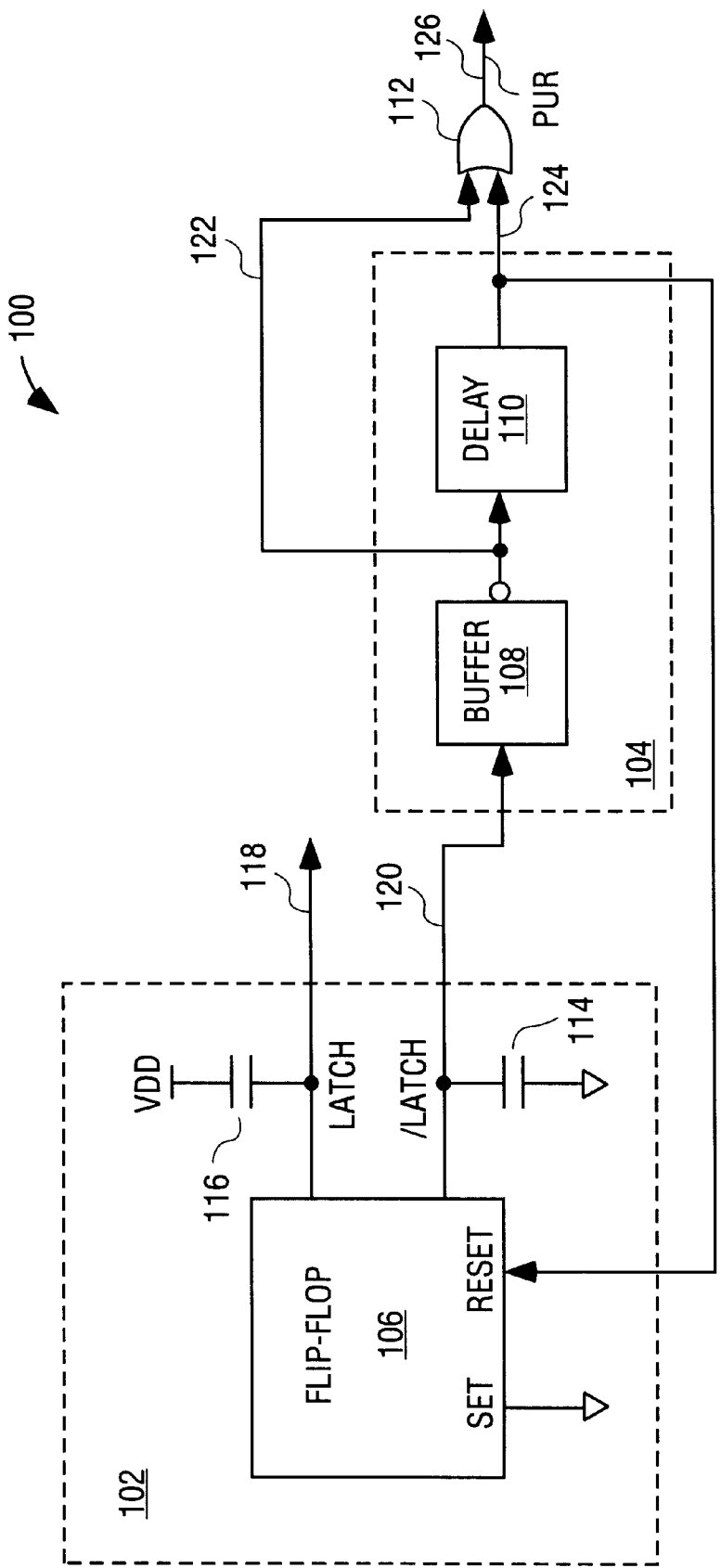
FIG. 1 is one embodiment of a power up reset circuit including an unbalanced latch, a feedback circuit, and an OR gate.

FIG. 1 is one embodiment of a power up reset circuit 100. Power up reset circuit 100 may be included within an integrated circuit or other system that requires a power up reset signal when power is supplied to the integrated circuit or system.

Power up reset circuit 100 includes unbalanced latch 102, feedback circuit 104, and OR gate 112. Unbalanced latch 102 includes flip-flop 106 having a set input, a reset input, and a pair of outputs. The set input is coupled to ground and the reset input is coupled to line 124. The first output provides a LATCH signal onto line 118, and a second output provides a /LATCH signal to line 120. The symbol "/" preceding a signal name will hereafter be used to denote an active low signal.

Unbalanced latch 102 also includes capacitors 114 and 116. Capacitor 114 has one terminal coupled to ground and the other terminal coupled to line 120. Capacitor 116 has one terminal coupled to VDD and another terminal coupled to line 118.

Unbalanced latch 102 is unbalanced or biased such that when power (VDD) is supplied to power up reset circuit 100 and unbalanced latch 102, unbalanced latch 102 will drive LATCH and its complement a /LATCH to predetermined states. Unbalanced latch 102 may be unbalanced in a number of different implementations. For one embodiment, flip-flop 106 may be unbalanced by appropriately sizing one or more transistors that make up flip-flop 106. For another embodiment, flip-flop 106 may be designed as an unbalanced flip-flop to output predetermined states for LATCH and /LATCH with the aide of capacitors 114 and 116. For yet another embodiment, one or both of capacitors 114 or 116 may be omitted.

For still another embodiment, flip-flop 106 may be a balanced flip-flop and one or both of capacitors 114 and 116 may be included in unbalanced latch 102 to cause LATCH and /LATCH to have predetermined states when VDD is applied to power up reset circuit 100 and unbalanced latch 102. When flip-flop 106 is balanced, it is indeterminate in which state LATCH and /LATCH will appear in response to the application of VDD to power up reset circuit 100 and unbalanced circuit 102. One or both of capacitors 114 and 116 may then cause the indeterminate state to be determinate.

Feedback circuit 104 is configured in a negative feedback arrangement with unbalanced latch 102. Feedback circuit 104 includes inverting buffer 108 and delay circuit 110. Buffer 108 has an input for receiving /LATCH from line 120, and an output for providing the complement of /LATCH to a first input of delay circuit 110 and one input of OR gate 112 via signal line 122. Delay circuit 110 has an output coupled to a second input of OR gate 124 and the reset input of flip-flop 106 via signal line 124. OR gate 112 outputs the power up reset signal (PUR) on line 126.

Delay circuit 110 outputs the signal from line 122 to line 124 after a characteristic or predetermined delay time Td. The delay time Td may be any time delay that causes in the power up reset signal output from OR gate 112 to be a guaranteed minimum time. A power up reset signal having a guaranteed minimum time is advantageous to properly reset subsequent flip-flops, state machines, registers, latches, or other circuit components receiving the power up reset signal. For one embodiment, the delay time is approximately 100 ns.

Figure 2:
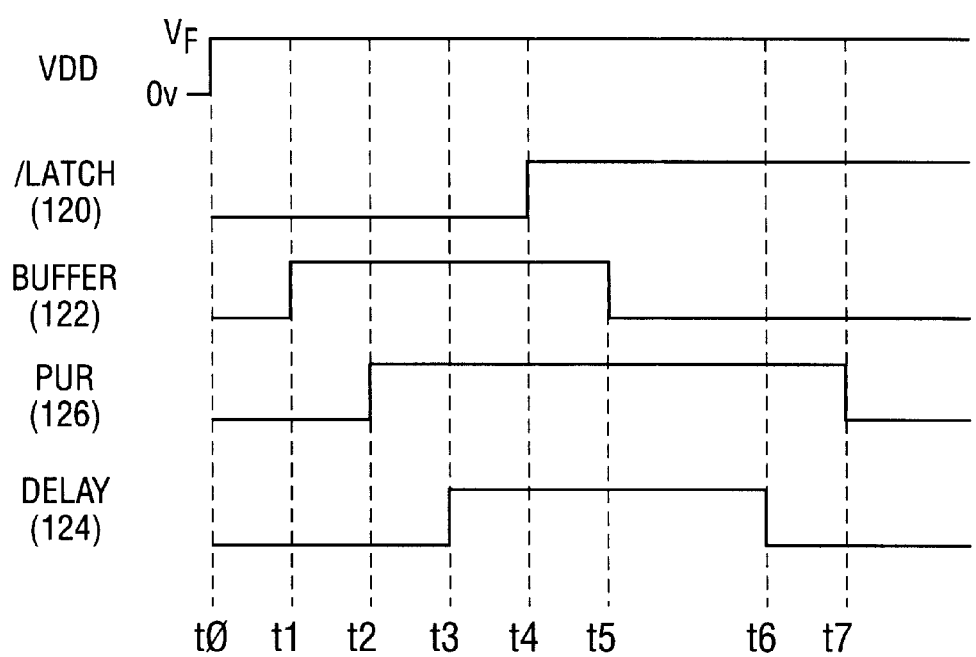
FIG. 2 is an illustrative timing diagram of the operation of the power up reset circuit of FIG. 1 when VDD ramps quickly.
Figure 3:
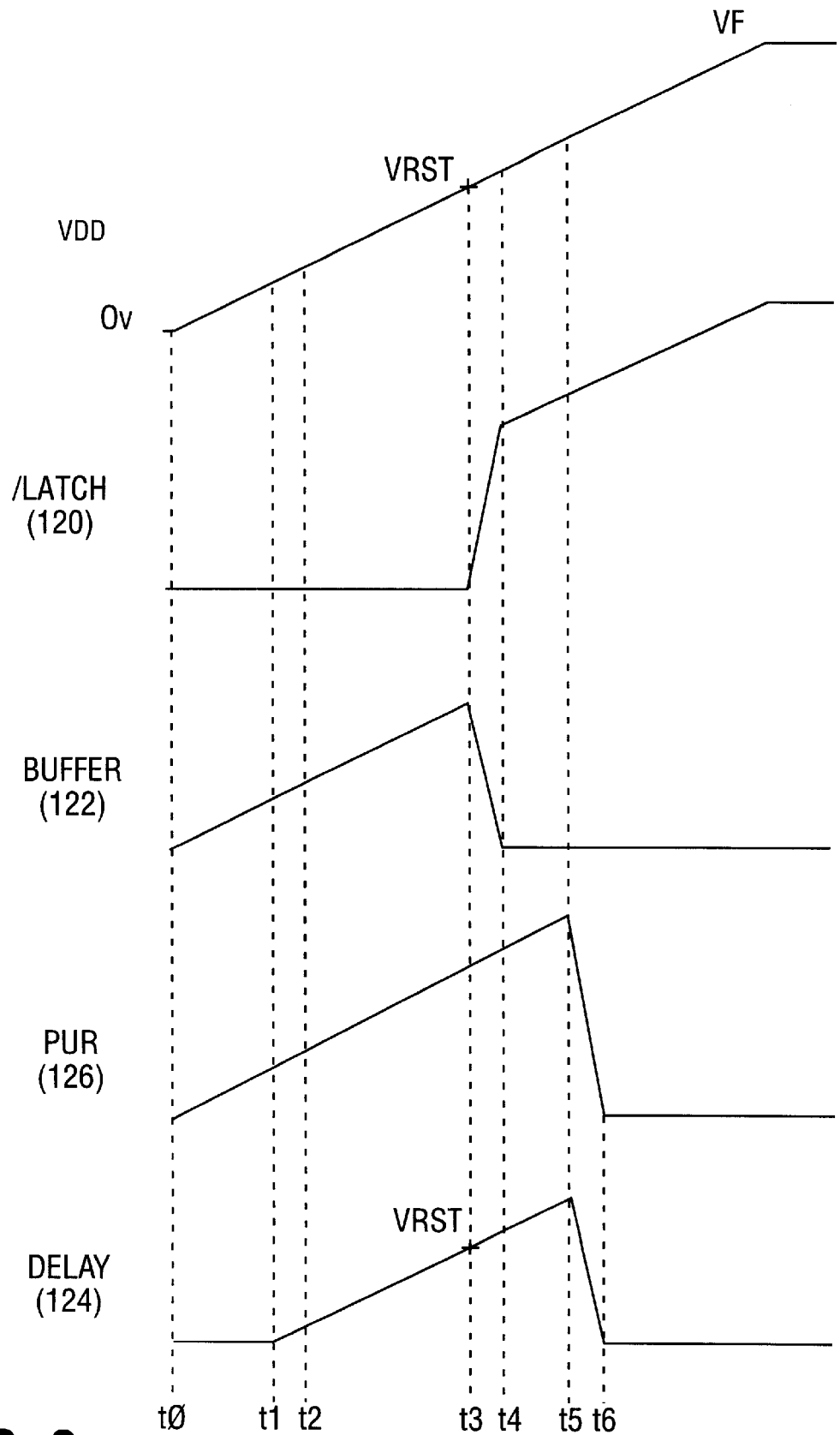
FIG. 3 is an illustrative timing diagram of the operation of the power up reset circuit of FIG. 1 when VDD ramps slowly.

The operation of power up reset circuit 100 may be described with the aide of the illustrative timing diagrams of FIGS. 2 and 3. FIG. 2 shows the operation of power up reset circuit 100 when VDD ramps quickly (e.g., significantly faster than the delay through delay circuit 110) from approximately zero volts to a final operating voltage VF. For one embodiment, VF may range from approximately twice the absolute threshold voltage of a NMOS or PMOS transistor included in flip-flop 106, buffer 108, delay circuit 100, or OR gate 112 to approximately three to seven volts. For other embodiments, VF may be other values.

At time t0, VDD is applied to power up reset circuit 100 and each of flip-flop 106, capacitor 116, buffer 108, delay circuit 110, and OR gate 112. Unbalanced latch 102 is unbalanced such that it generates /LATCH having a predetermined low state on line 120 in response to the application of VDD. After a delay through buffer 108, the signal on line 122 is asserted high at time t1. The high state of the signal on line 122 causes OR gate 112 to assert or activate the power up reset signal high on line 126 at time t2 after a delay through OR gate 112.

The high signal on line 122 is also delayed the predetermined delay time Td through delay circuit 110 (from time t1 to time t3) and then output to signal line 124 at time t3. The high state of the signal on line 124 will cause flip-flop 106 to be reset and /LATCH to be de-asserted to a high state at time t4. Buffer 108 will then drive a low state on line 122 at time t5, but the power up reset signal on line 126 will remain asserted because the signal on line 124 is still at a high state. The signal on line 124 will be de-asserted to a low state at time t6 after another delay time Td (from t5 to t6) through delay circuit 110. Subsequently, OR gate 112 will de-assert the power up reset signal to a low state on line 126 at time t7 after a delay through OR gate 112.

As illustrated in FIG. 2, the power up reset signal on line 126 is not de-asserted to a low state until a delay time Td after unbalanced latch 102 is reset. This guarantees that the power up reset signal will be asserted to a high state for a minimum amount of time after VDD has reached a sufficiently high voltage ($\geq$VRST) for subsequent circuit and logic elements receiving the power up reset signal to function properly.

For alternative embodiments, delay circuit 110 may be asymmetrically designed such that Td depends on the direction of the state transition of the signal on line 122. For example, Td may be shorter when the signal on line 122 transitions from a high state to a low state than when the signal on line 122 transitions from a low state to a high state. That is, the difference between t3 and t1 may be greater than the difference between t6 and t5. For another example, Td may be longer when the signal on line 122 transitions from a high state to a low state than when the signal on line 122 transitions from a low state to a high state. That is, the difference between t3 and t1 may be less than the difference between t6 and t5. For these alternative embodiments, the minimum pulse width may be less than the minimum pulse width when delay circuit 100 has symmetric delay times.

FIG. 3 shows the operation of power up reset circuit 100 when VDD ramps slowly (e.g., slower than the delays through buffer 108, delay circuit 110, and/or OR gate 112) from approximately zero volts to the final operating voltage VF.

At time t0, VDD is applied to power up reset circuit 100 and each of flip-flop 106, capacitor 116, buffer 108, delay circuit 110, and OR gate 112. As VDD ramps from approximately zero volts at time t0 to VF, the signal on line 122 and the power up reset signal on line 126 will approximately follow VDD.

After delay time Td, delay circuit 110 drives a high state on line 124 at time t1. The signal on line 124 will generally follow VDD. The signals on lines 122, 124, and 126 will continue to follow VDD until the signal on line 124 reaches the threshold voltage VRST of the reset input of flip-flop 106 at time t3. When the signal on line 124 reaches VRST, flip-flop 106 will de-assert /LATCH at time t3. /LATCH will then quickly rise to VDD at time t4 and continue to follow VDD to VF. As /LATCH rises towards VDD between times t3 and t4, buffer 108 will de-assert the signal on line 122 from VDD to ground. After the delay time Td (i.e., t5–t3), the signal on line 124 and the power up reset signal on line 126 will be de-asserted to a low state from time t5 to time t6.

As illustrated in FIG. 3, the power up reset signal on line 126 is not de-asserted to a low state until a delay time Td after unbalanced latch 102 is reset. This guarantees that the power up reset signal will be asserted to a high state for a minimum amount of time after VDD has reached a sufficiently high voltage ($\geq$VRST) for subsequent circuit and logic elements receiving the power up reset signal to function properly.

As described with respect to FIG. 2, for alternative embodiments, delay circuit 110 may be designed to have asymmetric delay times depending upon the direction of the state transition of the signal on line 122. For these alternative embodiments, the minimum pulse width may be less than the minimum pulse width when delay circuit 100 has symmetric delay times.

Various alterations and associated logic changes may be made to power up circuit 100 of FIG. 1, including omitting buffer 108, coupling the first input of OR gate 112 to line 118 instead of line 122, coupling the input of buffer 108 to line 118 instead of line 120, coupling the output of delay circuit 110 to the set input of flip-flop 106 instead of the reset input, and using the signal on line 122 or the signal on line 124 as the power up reset signal instead of the output of OR gate 112.

Power up reset circuit 100 of FIG. 1 may dissipate approximately zero static or DC power when power up signal PUR on line 126 is de-asserted by designing each of flip-flop 106, buffer 108, delay circuit 110, and OR gate 112 using CMOS transistors. For one embodiment, power up reset circuit 100 may dissipate approximately zero static or DC power when the current drawn by circuit 100 is less than approximately ten percent of the DC current through a P-channel transistor whose gate and drain are connected to ground, whose source and bulk are connected to the typical operating power supply VDD, and whose geometric width-to-length ratio (W/L) is approximately 0.01 (e.g., the P-channel transistor may have W=1.0 microns and L=100.0 microns) Under these conditions, the current drawn is negligibly small.

Additionally, using CMOS transistors enables power up reset circuit 100 to operate at a low operating supply voltage. For example, CMOS circuits may function correctly when VDD is the maximum of the absolute value of the threshold voltage of the NMOS or PMOS transistors making up the CMOS circuits of unbalanced latch 102, buffer 108, delay circuit 110, and OR gate 112.

Figure 4:
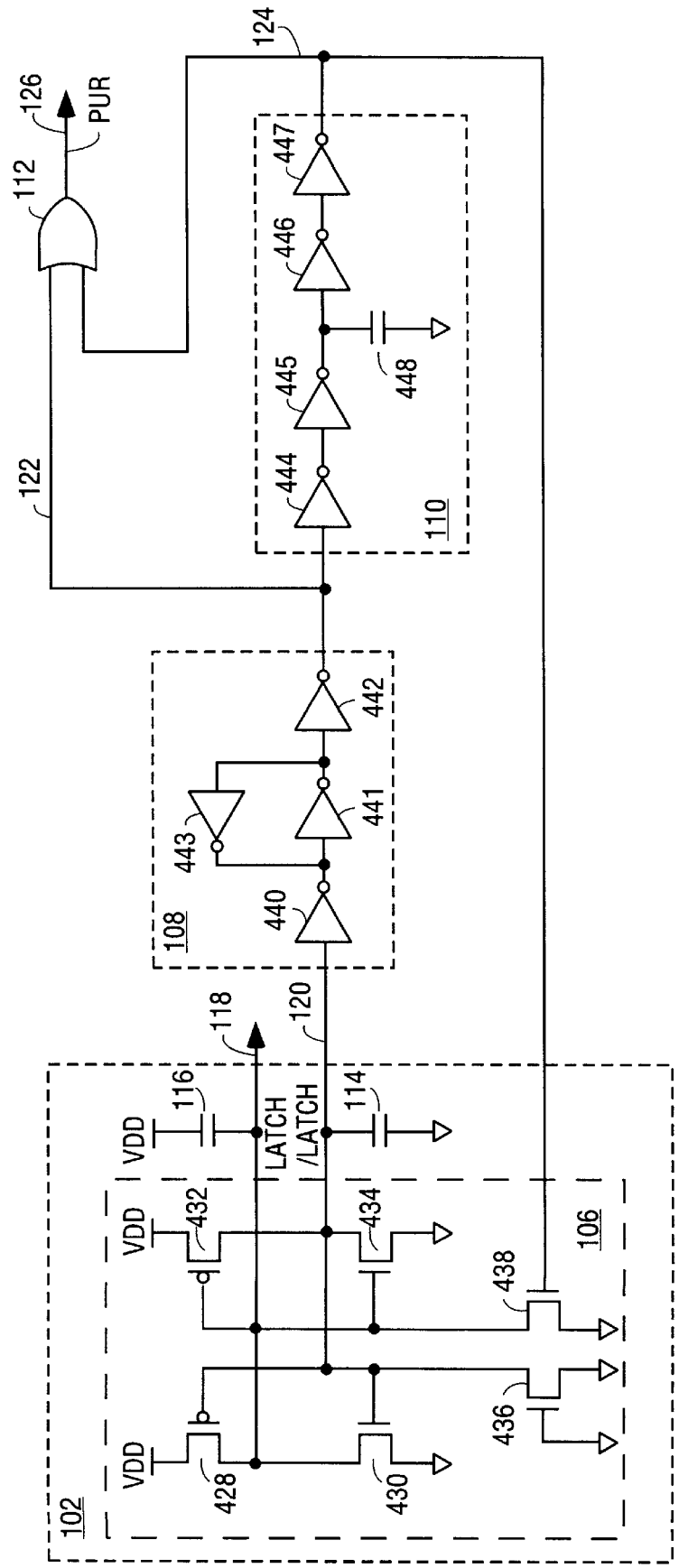
FIG. 4 is one embodiment of the power up reset circuit of FIG. 1.

FIG. 4 shows one embodiment of power up reset circuit 100. Flip-flop 106 includes two cross-coupled pairs of transistors. The first pair is formed by PMOS transistors 428 and 432, and the second pair formed by NMOS transistors 430 and 434. Transistors 428 and 430 form a first inverter, and transistors 432 and 434 form a second inverter.

Flip-flop 106 also includes NMOS transistor 438 that provides a means for resetting flip-flop 106. Transistor 438 has its gate coupled to line 124, its source coupled to ground, and its drain coupled to the gates of transistors 432 and 434, line 118, and the drains of transistors 428 and 430. When the signal on line 124 reaches the threshold voltage of transistor 438 (e.g., VRST of FIG. 3), transistor 438 will turn on and cause LATCH to be de-asserted to a low state and /LATCH to be de-asserted to a high state.

Flip-flop 106 also includes NMOS transistor 436 that provides a means for setting flip-flop 106. For this embodiment, transistor 436 has its source coupled to ground, and its drain coupled to the gates of transistors 428 and 430, line 120, and the drains of transistors 432 and 434. The gate of transistor 436 is coupled to ground disabling the set function of flip-flop 106. Transistor 436 may be included within flip-flop 106 to match the capacitance on line 120 with the capacitance provided on line 118 by transistor 438. Therefore, the unbalanced latch 102 will have its preferential states on LATCH and /LATCH controlled by capacitors 114 and 116, and by transistors 428, 430, 432, and 434 without appreciable influence by transistors 436 and 438. For an alternative embodiment, transistor 436 may be omitted.

Flip-flop 106 of FIG. 4 may be unbalanced in DC and transient operations. The DC imbalance may be accomplished by adjusting the width-to-length (W/L) ratios of one or more of transistors 428, 430, 432, and 434. For one embodiment, the W/L ratio of transistor 432 may be smaller than the W/L ratio of transistor 428. This may be accomplished be varying one or both of the width or length of transistors 428 and 432. Additionally, (and/or alternatively) the W/L ratio of transistor 430 may be smaller than the W/L ratio of transistor 434. With transistor 432 weaker than transistor 428, LATCH on line 118 is pulled up more strongly than /LATCH on line 120. Similarly, with transistor 430 weaker than transistor 434, LATCH on line 118 is pulled down more weakly than /LATCH on line 120. Each of these effects may cause LATCH to be preferentially asserted high and /LATCH to be preferentially asserted low in response to the application of VDD to flip-flop 106. The positive feedback provided by the cross-coupling of transistors 428 and 432, and transistors 432 and 434 serves to amplify the voltage difference on lines 118 and 120, so that LATCH rises to VDD while /LATCH falls to ground.

For alternative embodiments, one of transistors 428, 430, 432, or 434 may be weaker than another one of the transistors by placing a resistor in series with the source and/or drain of that transistor and VDD and/or ground. For another embodiment, transistor 432 may be replaced by a number n of P-channel transistors (n>1) connected in series, and/or transistor 430 may be replaced by a stack of n (n>1) N-channel transistors connected in series. Alternatively, transistors 432 and 430 may be replaced by stacks of transistors connected in series. Transistor 428 may also be replaced by a number j of P-channel transistors (j>1) connected in parallel, and/or transistor 434 may be replaced by a set of j N-channel transistors (j>1) connected in parallel. Alternatively, transistors 428 and 434 may be replaced by sets of transistors connected in parallel.

In transient operation (i.e., when VDD is applied to flip-flop 106), capacitors 114 and 116 aide in driving LATCH and /LATCH to preferential or predetermined states. During a rising transient of VDD, capacitor 116 couples LATCH up to VDD, while capacitor 114 couples /LATCH to ground. Capacitors 114 and 116 thus help to unbalanced latch 102 to power up with LATCH having a preferential high state, and /LATCH having a preferential low state.

For one embodiment, the capacitance of capacitors 114 and 116 are much larger than all other capacitance on lines 120 and 118, respectively. This ensures effective transient coupling of line 118 to VDD and line 120 to ground. For one embodiment, the capacitance of capacitor 114 may be approximately three times greater than all other capacitance coupled to line 120. Similarly, for one embodiment, the capacitance of capacitor 116 may be approximately three times greater than all other capacitance coupled to line 118. For one embodiment, the capacitance of capacitors 114 and 116 are approximately 1 to 10 picoFarads.

For alternative embodiments, one or none of capacitors 114 and 116 may be used in unbalanced latch 102. For still another embodiment, one or both of capacitors 114 and 116 may be used, and flip-flop 106 may have transistors 428, 430, 432, and 434 balanced (i.e., the same size).

Capacitors 114 and 116 may be formed using MOS transistors, or from other process techniques including polysilicon-to-polysilicon capacitors, polysilicon-to-diffusion capacitors, metal-to-metal capacitors, metal-to-polysilicon capacitors, and the like.

Buffer 108 includes inverters 440, 441, 442, and 443. For alternative embodiments, buffer 108 may include more or less inverters or other buffer elements. Inverters 441–442 are coupled in series with inverter 440 having its input coupled to line 120, and inverter 442 having its output coupled to line 122. Inverter 440 may be sized or designed to provide a capacitance to line 120 that is significantly smaller than the capacitance of capacitor 114 so as not to negatively impact the preferential power up state of unbalanced latch 102. Another inverter or other element having approximately the same capacitance as inverter 440 may also be coupled to line 118 to balance the loads on lines 118 and 120. Inverters 441 and 442 buffer and amplify the signal output by inverter 440.

Inverter 443 may optionally be included to provide a hysteresis function in buffer 108. Inverter 443 has its input coupled to the input of inverter 442, and its output coupled to the output of inverter 440. The amount of hysteresis may be controlled by the relative driving capabilities of inverters 443 and 440. For one embodiment, inverter 443 may be approximately ten times weaker than inverter 440 resulting in about 10 percent hysteresis. Without inverter 443, the power up reset signal on line 126 may oscillate for a period of time until it is de-asserted when /LATCH is de-asserted to a high state.

Delay circuit 110 includes inverters 444, 445, 446, and 447 coupled in series. Inverter 444 has its input coupled to line 122, and inverter 447 has its output coupled to line 124. For other embodiments, delay circuit 110 may include more or less inverters or other inverting or non-inverting delay elements (e.g., resistors). Delay circuit 110 may also optionally include capacitor 448 coupled between the output of inverter 445 and ground. Capacitor 448 slows down the switching speed of inverter 445. Capacitor 448 causes an asymmetric delay of time through delay circuit 110. For example, capacitor 448 causes the delay time through delay circuit 110 to be slower when the signal on line 122 transitions from a low state to a high state than when the signal on line 122 transitions from a high state to a low state. The delay time through delay circuit 110 may be symmetric if capacitor 448 is removed or if another capacitor of approximately equal size is coupled between the output of inverter 445 and VDD.

Each of inverters 440–447 may be manufactured as CMOS inverters such that each of unbalanced latch 102, buffer 108, delay circuit 110, and OR gate 112 are manufactured from a CMOS process. This enables power up reset circuit 100 to dissipate approximately zero static or DC power when the power up reset signal on line 126 is de-asserted. Additionally, this allows power up reset circuit 100 to operate at very low power supply voltages. For example, power up reset circuit 100 of FIG. 4 will be able to assert and then de-assert the power up reset signal on line 125 when VDD transitions from approximately zero volts to the threshold voltage of the NMOS transistor 438. The supply voltage at which the power up reset signal is de-asserted may be raised be placing a voltage divider circuit between the output of delay circuit 110 and the reset input of flip-flop 106 as will be described below.

Figure 5:
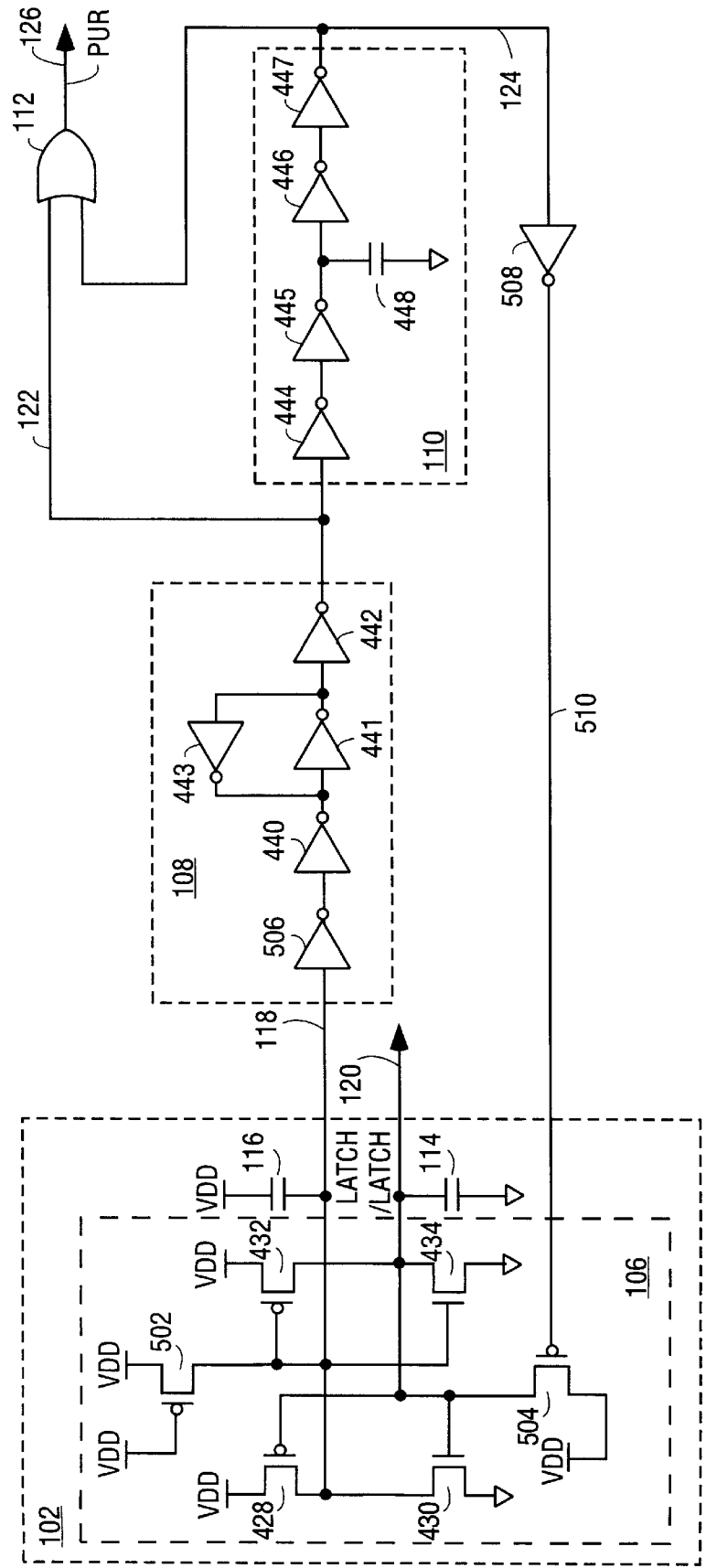
FIG. 5 is another embodiment of the power up reset circuit of FIG. 1.

It is advantageous for VRST to be as high as possible relative to VF such that the power up reset signal on line 126 is de-asserted when VDD is at a sufficiently high voltage to ensure proper reset of subsequent circuits and logic elements. As VRST corresponds to the threshold voltage of transistor 438, it is therefore advantageous to reduce the variation of the threshold voltage of transistor 438 across changes in operating temperature, process changes, and source-to-bulk voltages (back bias). In some processes it may be preferable to use PMOS transistors in place of NMOS transistors 436 and 438. This may be advantageous when the variability in the threshold voltages of the PMOS transistors is less than the threshold voltages of NMOS transistors across variations in operating temperature, process parameters, and source-to-bulk (back bias) voltage. For example, the threshold voltage of PMOS transistors may have less variation than NMOS transistors in a twin-well process wherein voltage of the bulk material of the NMOS transistors is pumped from ground to a back bias voltage. FIG. 5 is another embodiment power up reset circuit 100 with NMOS transistors 436 and 438 replaced by PMOS transistors 502 and 504, respectively,. Relative to FIG. 4, the power up reset circuit of FIG. 5 also includes additional inverters 506 and 508, and buffer 108 has its input coupled to line 118 rather than line 120.

Transistor 504 provides a means for resetting flip-flop 106. Transistor 504 has its gate coupled to line 510, its source coupled to VDD, and its drain coupled to the gates of transistors 428 and 430, line 120, and the drains of transistors 432 and 434. Line 510 is coupled to the output of inverter 508. Inverter 508 has its input coupled to line 124. For an alternative embodiment, the gate of transistor 504 may be coupled directly to the output of inverter 446.

Flip-flop 106 also includes PMOS transistor 502 that provides a means for setting flip-flop 106. For this embodiment, transistor 502 has its source coupled to VDD, and its drain coupled to the gates of transistors 432 and 434, line 120, and the drains of transistors 428 and 430. The gate of transistor 502 is coupled to VDD disabling the set function of flip-flop 106. Transistor 502 may be included within flip-flop 106 to match the capacitance on line 118 with the capacitance provided on line 120 by transistor 504. Therefore, the unbalanced latch 102 will have its preferential states on LATCH and /LATCH controlled by capacitors 114 and 116, and by transistors 428, 430, 432, and 434 without appreciable influence by transistors 502 and 504. For an alternative embodiment, transistor 502 may be omitted.

Buffer 108 includes inverter 506 coupled in series with inverters 440, 441, 442, and 443. Inverter 506 has its input coupled to line 118 and its output coupled to the input of inverter 440. As shown in FIG. 5, buffer 108 is configured to receive the LATCH signal rather than the /LATCH signal as in FIG. 4.

The operation of the power up reset circuit of FIG. 5 may be described as follows. When VDD is applied to the power up reset circuit of FIG. 5, unbalanced latch 102 preferentially asserts LATCH to a high state on line 118. This high state is sent through buffer 108 (that is now non-inverting) causing the signals on lines 122 and 126 to be asserted high. After a delay Td through delay circuit 110, the high signal on line 124 is inverted by inverter 508 and causes transistor 504 to turn on and de-assert LATCH to a low state and /LATCH to a high state. After delays through buffer 108 and delay circuit 110, the power up reset signal on line 126 will be de-asserted to a low state.

Figure 6:
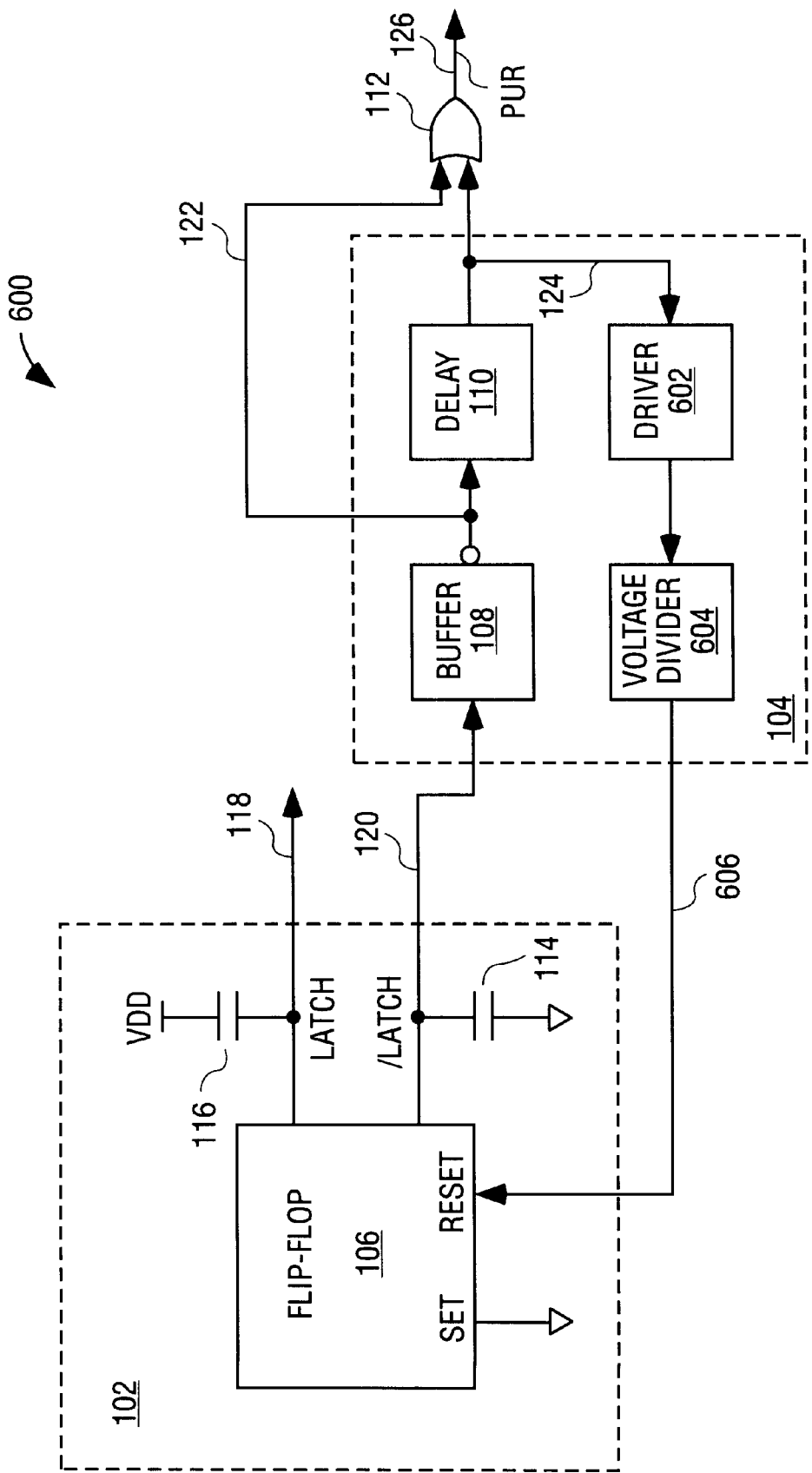
FIG. 6 is another embodiment of a power up reset circuit including an unbalanced latch, a feedback circuit, and an OR gate.

FIG. 6 shows power up reset circuit 600. Power up reset circuit 600 is a variation on power up reset circuit 100 of FIG. 1. In addition to buffer 108 and delay circuit 110, feedback circuit 104 includes driver 602 and voltage divider circuit 604. Driver circuit 602 has an input coupled to line 124, and an output coupled to voltage divider 604. Voltage divider 604 has an output coupled to the reset input of flip-flop 106 via line 606. Driver circuit 602 is optional and may be omitted.

Power up reset circuit 600 operates in the same fashion as power up reset circuit 100 except that flip-flop 106 will not be reset until the output of voltage divider 604 reaches the threshold voltage VRST of flip-flop 106. When VDD ramps quickly from approximately ground to its final operating voltage VF, voltage divider 604 and driver 602 provide additional delay in feedback circuit 104. However, when VDD ramps slowly from approximately zero volts to VF, voltage divider 604 impacts the power supply voltage (relative to FIG. 1) at which the power up reset signal PUR on line 126 will be de-asserted. As will be described below, the power supply voltage at which power up reset signal PUR is de-asserted will be increased relative to power up reset circuit 100 of FIG. 1.

Figure 7:
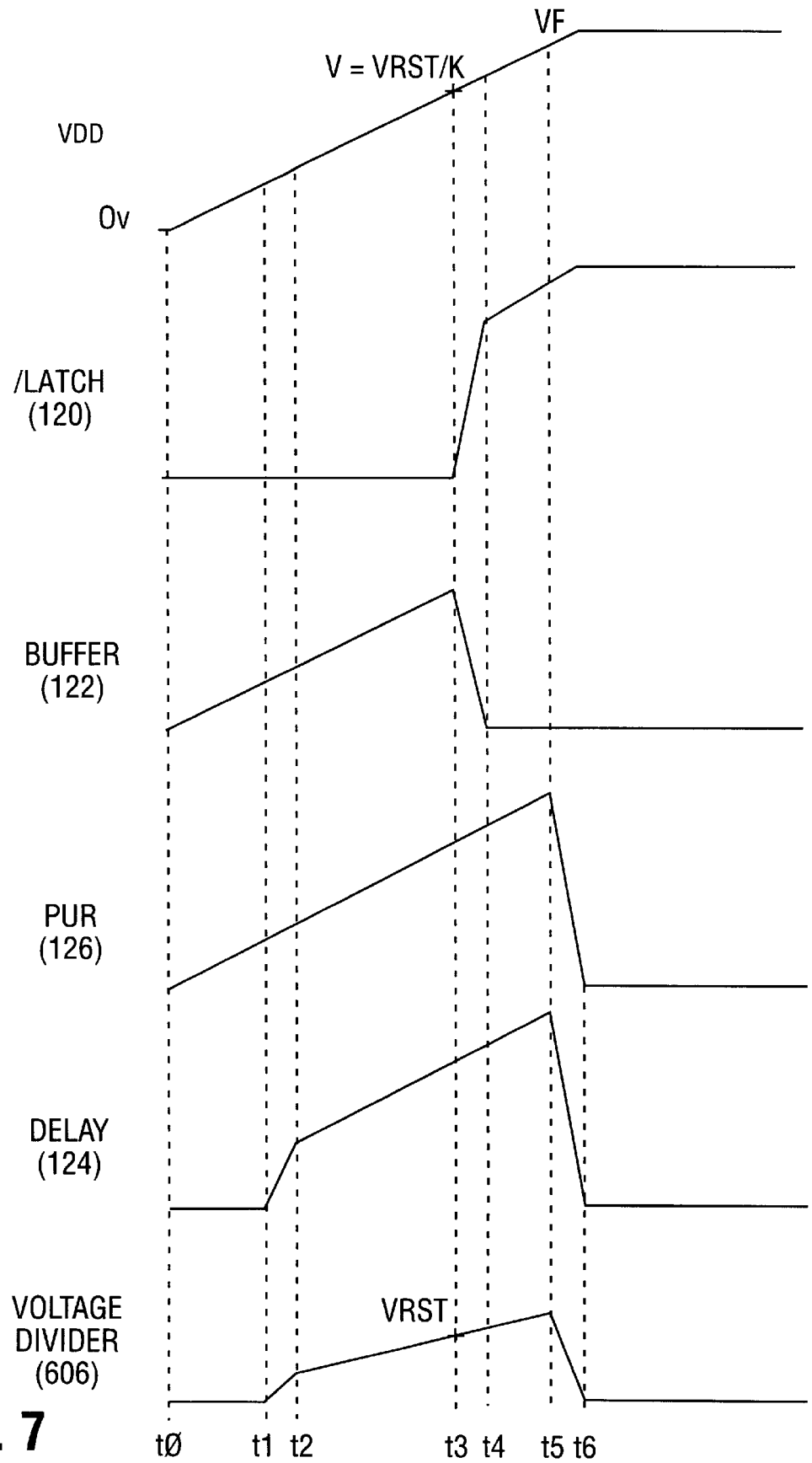
FIG. 7 is an illustrative timing diagram of the operation of the power up reset circuit of FIG. 6 when VDD ramps slowly.

The operation of power up reset circuit 600 may be illustrated with the aid of the illustrative timing diagram of FIG. 7. FIG. 7 shows the operation of the power up reset circuit 600 when VDD ramps slowly (e.g., slower than the delays through buffer 108, delay circuit 110, and/or OR gate 112) from approximately zero volts or ground to a final operating voltage VF.

At time t0, VDD is applied to power up reset circuit 600 and each of flip-flop 106, feedback circuit 104, and OR gate 112. Unbalanced latch 102 is unbalanced such that it generates /LATCH having a predetermined low state on line 120 in response to the application of VDD to power up reset circuit 600. As VDD ramps from approximately zero volts at time t0 to VF, the signal on line 122 and the power up reset signal on line 126 will approximately follow VDD.

After delay time Td, delay circuit 110 drives a high state on line 124 at time t1. The signal on line 124 will quickly rise to the current voltage of VDD at time t2, and then will follow VDD. The signals on lines 122, 124, and 126 will continue to follow VDD (together with the output of driver circuit 602) until the signal on line 606 reaches the threshold voltage VRST of flip-flop 106 at time t3.

The voltage level of the signal output by voltage divider 606 is a number K times the voltage output by driver circuit 602, where K≦1. Given that the voltage output of driver circuit 602 is VDD, then the voltage output by voltage divider circuit 604 is K×VDD. When the output of voltage divider 604 reaches VRST, then VDD is equal to VRST/K. Since K is less than or equal to one, VDD at time t3 is greater than or equal to VRST at time t3 for power up reset circuit 100 of FIG. 1. Therefore, this will raise the VDD voltage at which the power up reset signal will be de-asserted, and will generally increase the minimum pulse width of the power up reset signal on line 126 relative to power up reset circuit 100 of FIG. 1. It is generally advantageous to provide a higher supply voltage for subsequent circuits or logic elements receiving the power up reset signal because VDD may be more stable and there may be a greatly likelihood that these circuits will be properly reset.

When the signal on line 606 reaches VRST, flip-flop 106 will de-assert /LATCH at time t3. /LATCH will then quickly rise to VDD at time t4 and continue to follow VDD to VF. As /LATCH rises to towards VDD between times t3 and t4, buffer 108 will de-assert the signal on line 122 from VDD to ground. After the delay time Td (i.e., t5–t3), the signal on line 124 and the power up reset signal on line 126 will be de-asserted to a low state from time t5 to time t6.

As described with respect to FIG. 1, power up reset circuit 600 of FIG. 6 may dissipate approximately zero static or DC power when power up signal PUR on line 126 is de-asserted by designing each of flip-flop 106, feedback circuit 104, and OR gate 112 using CMOS transistors. Additionally, using CMOS transistors enables power up reset circuit 600 to operate at low operating supply voltages. For example, the power up reset signal on line 126 may be asserted as VDD transitions from approximately zero volts to VRST/K. The power up reset signal on line 126 may be de-asserted as VDD continues to rise above VRST/K.

Figure 8:
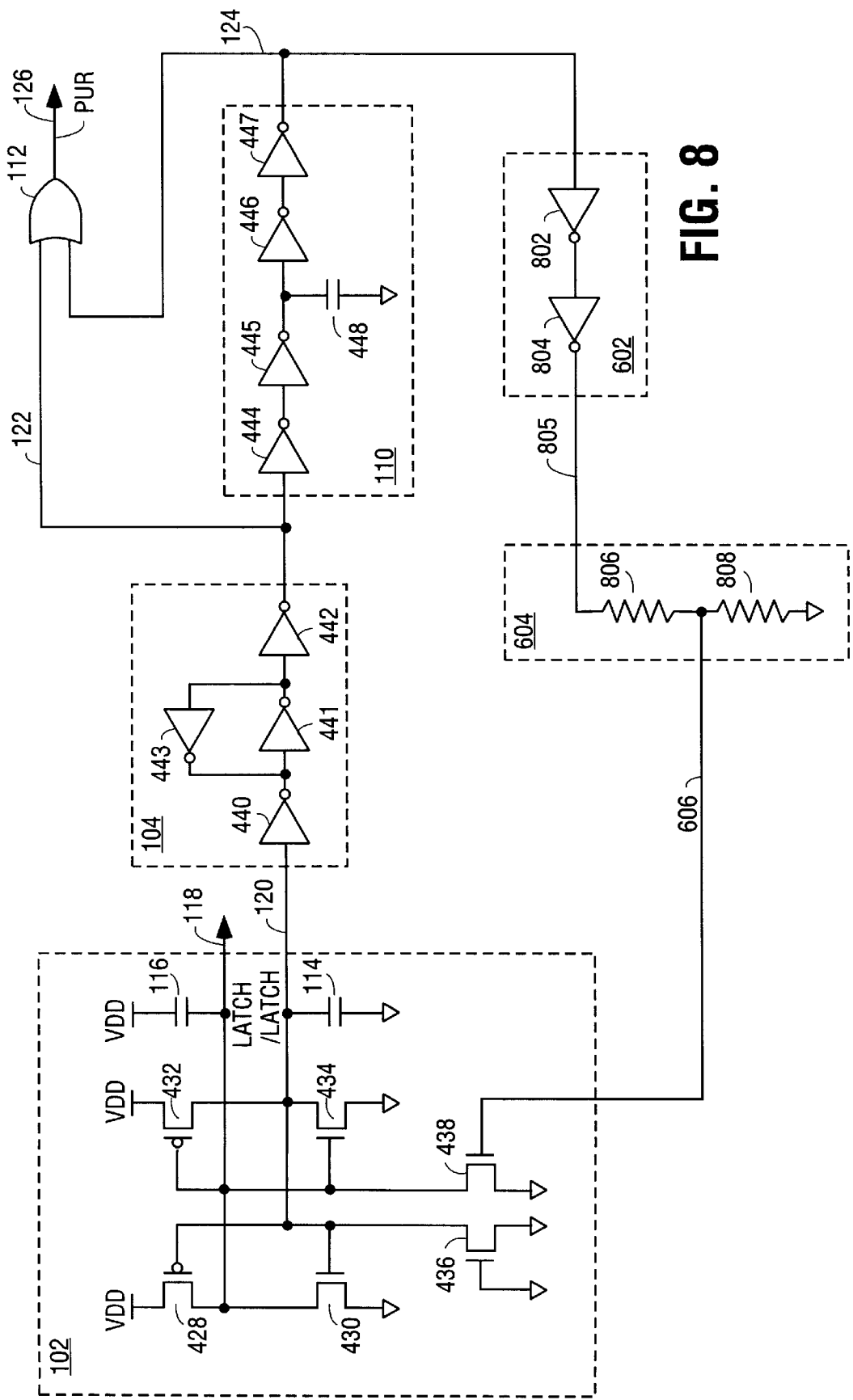
FIG. 8 is one embodiment of the power up reset circuit of FIG. 6.

FIG. 8 shows one embodiment of power up reset circuit 600 of FIG. 6. Unbalanced latch 102, buffer 108, and delay circuit 110 operate as described with respect to the power up reset circuit of FIG. 4. The power up reset circuit of FIG. 8 additionally includes driver circuit 602 and voltage divider circuit 604. Driver circuit 602 includes inverters 802 and 804 coupled in series. The input of inverter 802 is coupled to line 124, and the output of inverter 804 is coupled to line 805.

Voltage divider circuit 604 includes two resistors 806 and 808 coupled in series. Resistor 806 has one terminal coupled to line 805 and the other terminal coupled to line 606. Resistor 808 has one terminal coupled to line 606 and the other terminal coupled to ground. For this embodiment, K is equal to the resistance of resistor 808 divided the sum of the resistance of resistors 806 and 808 (i.e., $R_{808}/(R_{806}+R_{808})$). For one embodiment, resistors 806 and 808 have the same resistance value and K is equal to ½. For this embodiment, flip-flop 106 will de-assert /LATCH to a high state when VDD is equal to two times the threshold voltage of transistor 438.

Resistors 806 and 808 may be formed from any type of process technique including N+ diffusion, polysilicon, MOS transistors, and switched capacitors. For other embodiments, resistors 806 and 808 may be impedances. For an alternative embodiment, NMOS and/or PMOS transistors may be placed in parallel with resistors 806 and 808 to help track the resistance values provided by resistors 806 and 808 with NMOS or PMOS parameters that change with changing operating conditions (process, voltage, and/or temperature) of the power up reset circuit of FIG. 8.

Figure 9:
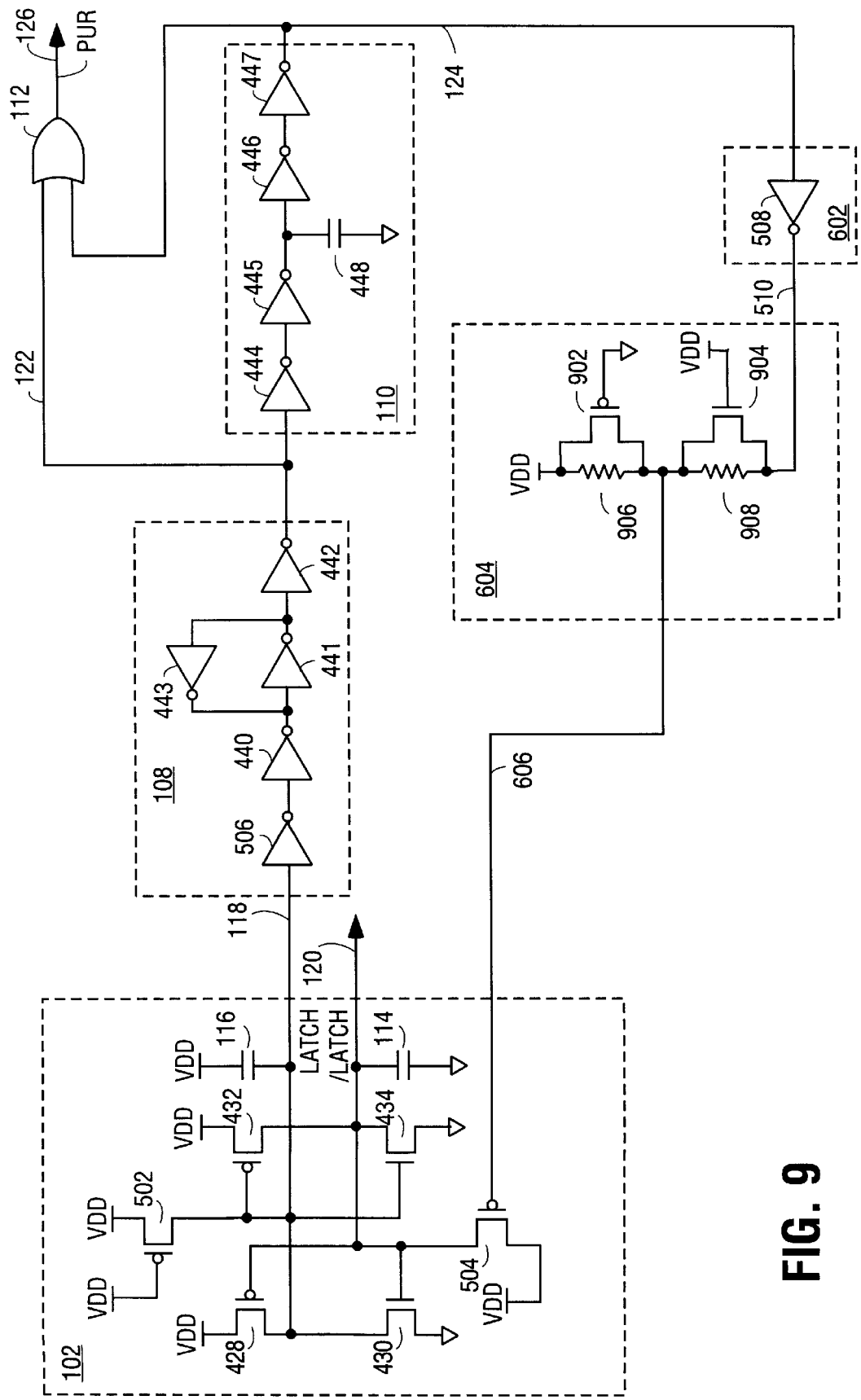
FIG. 9 is another embodiment of the power up reset circuit of FIG. 6.

FIG. 9 is another embodiment of power up reset circuit 600 of FIG. 6. The power up reset circuit of FIG. 9 is a modification of the power up reset circuit of FIG. 5 wherein PMOS transistor 504 is used to reset flip-flop 106. Unbalanced latch 102, buffer 108, and delay circuit 110 operate as previously described with respect to the power up reset circuit of FIG. 5. The power up reset circuit of FIG. 9 additionally includes driver circuit 602 and voltage divider circuit 604. Driver circuit 602 includes inverter 508 (as illustrated in FIG. 5) having an input coupled to line 124 and an output coupled to line 510.

Voltage divider circuit 604 includes two resistors 906 and 908 coupled in series. Resistor 906 has one terminal coupled to VDD and the other terminal coupled to line 606. Resistor 908 has one terminal coupled to line 606 and the other terminal coupled to line 510. For this embodiment, K is equal to the resistance of resistor 908 divided the sum of the resistance of resistors 906 and 908 (i.e., R908/(R906+R908)). Resistors 906 and 908 may be formed from any type of process technique including N+ diffusion, polysilicon, MOS transistors, and switched capacitors. For other embodiments, resistors 906 and 908 may be impedances.

For this embodiment, a particular voltage may be output on line 606 by the configuration of resistors 906 and 908. By adjusting the resistance values of resistors 906 and 908 a desired voltage may be selected to be driven onto line 606 to reset flip-flop 106 via PMOS transistor 504.

Voltage divider circuit 604 may also optionally include NMOS transistor 904 coupled in parallel with resistor 908, and PMOS transistor 902 coupled in parallel with resistor 906. Transistor 902 may be one or more PMOS transistors. Similarly, transistor 904 may be one or more NMOS transistors. Transistor 902 may help to track the resistance provided by resistor 906 and transistor 902 with changes in PMOS parameters caused by changing operating conditions (process, voltage, and/or temperature) of the power up reset circuit of FIG. 9. Similarly, transistor 904 may help to track the resistance provided by resistor 908 and transistor 904 with changes in NMOS parameters caused by changing operating conditions (process, voltage, and/or temperature) of the power up reset circuit of FIG. 9.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A pulse generating circuit comprising:
   an unbalanced latch to generate a latch signal having a predetermined state in response to application of power to the pulse generating circuit; and
   a feedback circuit coupled in a negative feedback arrangement with the unbalanced latch and generating a pulse signal for a predetermined period of time in response to the latch signal, wherein the feedback circuit comprises a voltage divider and a delay circuit, the voltage divider coupled between the delay circuit and the unbalanced latch, the delay circuit providing a signal having an active time less than an active time of the pulse signal, and wherein the unbalanced latch comprises a flip-flop having a set input coupled to receive the pulse signal.

2. The pulse generating circuit of claim 1, wherein the unbalanced latch further comprises a capacitor coupled to the flip-flop.

3. The pulse generating circuit of claim 1, wherein the feedback circuit further comprises buffer coupled to the delay circuit.

4. The pulse generating circuit of claim 1, wherein the pulse generating circuit draws approximately zero direct current (DC) power when the pulse signal is inactive.

5. The pulse generating circuit of claim 4, wherein the unbalanced latch and the feedback circuit comprise complementary metal oxide semiconductor (CMOS) transistors.

6. The pulse generating circuit of claim 1, wherein the unbalanced latch has a transistor having a threshold voltage and is configured to receive the pulse signal.

7. The pulse generating circuit of claim 6, wherein the transistor is an NMOS transistor.

8. The pulse generating circuit of claim 6, wherein the transistor is a PMOS transistor.

9. The pulse generating circuit of claim 1, wherein the pulse generating circuit is incorporated in a dynamic random access memory (DRAM) circuit.

10. A pulse generating circuit comprising:
    an unbalanced latch configured to generate a latch signal having a predetermined state in response to application of power to the pulse generating circuit;
    a delay circuit coupled in a feedback arrangement with the unbalanced latch and generating a delayed latch signal after a delay time; and
    a logic circuit coupled to the delay circuit and the unbalanced latch and configured to generate a pulse signal in response to the delayed latch signal.

11. The pulse generating circuit of claim 10, wherein the unbalanced latch comprises a flip-flop.

12. The pulse generating circuit of claim 11, wherein the unbalanced latch further comprises a capacitor coupled to the flip-flop.

13. The pulse generating circuit of claim 11, wherein the flip-flop has a reset input coupled to receive the delayed latch signal.

14. The pulse generating circuit of claim 11, wherein the flip-flop has a set input coupled to receive the delayed latch signal.

15. The pulse generating circuit of claim 10, further comprising a buffer coupled between the delay circuit and the unbalanced latch.

16. The pulse generating circuit of claim 10, further comprising a voltage divider circuit coupled between the delay circuit and the unbalanced latch.

17. The pulse generating circuit of claim 10, wherein the pulse generating circuit draws approximately zero direct current (DC) power when the pulse signal is inactive.

18. The pulse generating circuit of claim 17, wherein the unbalanced latch, the delay circuit, and the logic circuit comprise complementary metal oxide semiconductor (CMOS) transistors.

19. The pulse generating circuit of claim 10, wherein the unbalanced latch has a transistor having a threshold voltage and is configured to receive the delayed latch signal.

20. The pulse generating circuit of claim 19, wherein the transistor is an NMOS transistor.

21. The pulse generating circuit of claim 19, wherein the transistor is a PMOS transistor.

22. The pulse generating circuit of claim 10, wherein the logic circuit comprises an OR gate.

23. The pulse generating circuit of claim 10, wherein the pulse generating circuit is incorporated in a dynamic random access memory (DRAM) circuit.

24. A method of generating a pulse signal comprising:
    outputting a first signal having a first predetermined state from an unbalanced latch in response to an application of power to the unbalanced latch;
    generating a first edge of the pulse signal in response to the first signal;
    generating a second signal based on the first signal after a first amount of delay time;
    transitioning the first signal to a second state in response to the second signal; and
    generating a second edge of the pulse signal in response to the second state of the first signal using a logic circuit.

25. The method of claim 24, wherein the transitioning occurs when the second signal reaches a threshold voltage of the unbalanced latch.

26. The method of claim 24, further comprising applying the second signal to the unbalanced latch.

27. The method of claim 24, wherein the second edge of the pulse signal is generated a second amount of delay time after transitioning the first signal.

28. The method of claim 27, wherein the second amount of delay time depends on a state transition of a buffered signal.

29. The method of claim 27, wherein the second amount of delay time is longer when the buffered signal transitions from a high state to a low state than when the buffered signal transitions from the low state to the high state.

* * * * *